US011038027B2

(12) United States Patent
Karda et al.

(10) Patent No.: US 11,038,027 B2
(45) Date of Patent: Jun. 15, 2021

(54) INTEGRATED ASSEMBLIES HAVING POLYCRYSTALLINE FIRST SEMICONDUCTOR MATERIAL ADJACENT CONDUCTIVELY-DOPED SECOND SEMICONDUCTOR MATERIAL

(71) Applicant: Micron Technology, inc., Boise, ID (US)

(72) Inventors: Kamal M. Karda, Boise, ID (US);
Deepak Chandra Pandey, Uttarakhand (IN); Haitao Liu, Boise, ID (US);
Richard J. Hill, Boise, ID (US);
Guangyu Huang, Boise, ID (US);
Yunfei Gao, Boise, ID (US);
Ramanathan Gandhi, Boise, ID (US);
Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 16/294,759

(22) Filed: Mar. 6, 2019

(65) Prior Publication Data

US 2020/0287003 A1 Sep. 10, 2020

(51) Int. Cl.
*H01L 29/267* (2006.01)
*H01L 29/786* (2006.01)
(Continued)

(52) U.S. Cl.
CPC ...... *H01L 29/267* (2013.01); *H01L 27/10805* (2013.01); *H01L 29/0847* (2013.01);
(Continued)

(58) Field of Classification Search
CPC .............. H01L 29/7869; H01L 27/10805
See application file for complete search history.

(56) References Cited

U.S. PATENT DOCUMENTS 4,237,473 A 12/1980 Chiang
5,138,407 A 8/1992 Hirtz et al.
(Continued)

FOREIGN PATENT DOCUMENTS

KR 10-1368191 2/2014
WO WO 2019/022944 1/2019

OTHER PUBLICATIONS

Chu et el., Physical Properties of InGaO3(ZnO)m with various content ratio grown by PAMBE,2015,Journal of Crystal Growth, vol. 425, pp. 258-261 (Year: 2015).*
(Continued)

*Primary Examiner* — Khaja Ahmad
*Assistant Examiner* — Khatib A Rahman
(74) *Attorney, Agent, or Firm* — Wells St. John P.S.

(57) ABSTRACT

Some embodiments include an integrated assembly having a polycrystalline first semiconductor material, and having a second semiconductor material directly adjacent to the polycrystalline first semiconductor material. The second semiconductor material is of a different composition than the polycrystalline first semiconductor material. A conductivity-enhancing dopant is within the second semiconductor material. The conductivity-enhancing dopant is a neutral-type dopant relative to the polycrystalline first semiconductor material. An electrical gate is adjacent to a region of the polycrystalline first semiconductor material and is configured to induce an electric field within said region of the polycrystalline first semiconductor material. The gate is not adjacent to the second semiconductor material.

37 Claims, 5 Drawing Sheets

(51) Int. Cl.
*H01L 27/108* (2006.01)
*H01L 29/207* (2006.01)
*H01L 29/08* (2006.01)
*H01L 29/16* (2006.01)

(52) U.S. Cl.
CPC ............ *H01L 29/16* (2013.01); *H01L 29/207* (2013.01); *H01L 29/7869* (2013.01); *H01L 29/78675* (2013.01)

(56) References Cited

U.S. PATENT DOCUMENTS

| | | | |
|---|---|---|---|
| 5,930,611 | A | 7/1999 | Okamoto |
| 7,071,065 | B1 | 7/2006 | Xiang et al. |
| 7,767,525 | B2* | 8/2010 | Manning ............ H01L 27/10876 438/268 |
| 8,431,459 | B2 | 4/2013 | Takenaka et al. |
| 8,823,011 | B2 | 9/2014 | Chan |
| 2006/0172483 | A1* | 8/2006 | Forbes ................ H01M 8/1213 438/212 |
| 2011/0108885 | A1 | 5/2011 | Sazawa et al. |
| 2011/0233512 | A1* | 9/2011 | Yang ...................... B82Y 10/00 257/9 |
| 2012/0080753 | A1 | 4/2012 | Singh et al. |
| 2012/0153371 | A1 | 6/2012 | Chen et al. |
| 2013/0149830 | A1 | 6/2013 | Rhee et al. |
| 2013/0341701 | A1* | 12/2013 | Blomme .............. H01L 21/764 257/324 |
| 2014/0054678 | A1* | 2/2014 | Hu ...................... H01L 29/7827 257/329 |
| 2014/0264277 | A1* | 9/2014 | Doornbos .............. B82Y 40/00 257/24 |
| 2015/0357334 | A1 | 12/2015 | Hu et al. |
| 2016/0086957 | A1 | 3/2016 | Cho et al. |
| 2016/0260775 | A1 | 9/2016 | Takaki |
| 2017/0033192 | A1 | 2/2017 | Wang et al. |
| 2017/0141119 | A1* | 5/2017 | Hu ................... H01L 27/11582 |
| 2018/0061835 | A1* | 3/2018 | Yang ................ H01L 29/42376 |
| 2018/0097053 | A1* | 4/2018 | Park .................... H01L 27/3248 |
| 2019/0013404 | A1 | 1/2019 | Carlson et al. |
| 2019/0371911 | A1* | 12/2019 | Miao .................. H01L 29/0847 |
| 2019/0393104 | A1* | 12/2019 | Ando ................ H01L 21/02532 |
| 2019/0393222 | A1* | 12/2019 | Sharma ............ H01L 27/10817 |
| 2020/0111800 | A1* | 4/2020 | Ramaswamy .... H01L 27/10873 |
| 2020/0168724 | A1* | 5/2020 | Huang ............. H01L 29/66356 |

OTHER PUBLICATIONS

Baliga, "Semiconductors for High-Voltage, Vertical Channel Field-Effect Transistors," Journal of Applied Physics, 53 (1759), 1982, pp. 1759-1784.

Kang et al., "Change in Electrical Characteristics of Gallium Phosphide Nanowire Transistors Under Different Environments", 4th IEEE Conference on Nanotechnology, Munich, Germany, Aug. 16-19, 2004, pp. 370-372.

Manna et al., "A Novel Si/SiGe Sandwich Polysilicon TFT for SRAM Applications", 53rd Annual Device Research Conference Digest, Chartlottesville, VA, Jun. 19-21, 1995, pp. 156-157.

Pal et al., "Addressing Key Challenges in 1T-DRAM: Retention Time, Scaling and Variability—Using a Novel Design with GaP Source-Drain", IEEE, International Conference on Simulation of Semiconductor Processes and Devices (SISPAD). Glasgow, UK, Sep. 3-5, 2013, pp. 376-379.

Pal et al., "GaP Source-Drain SOI 1T-DRAM: Solving the Key Technological Challenges", IEEE SOI-ED—Subthreshold Microelectronics Technology Unified COnference (S3S), Monterey, CA, Oct. 7-10, 2013, pp. 2 pages.

U.S. Appl. No. 15/848,982, filed Dec. 20, 2017 by Ramaswamy.
U.S. Appl. No. 15/890,147, filed Feb. 6, 2019 by Ramaswamy.
WO PCT/US2020/020212 Search Rept, Jun. 26, 2020, Micron Technology, Inc.
WO PCT/US2020/020212 Written Opin, Jun. 26, 2020, Micron Technology, Inc.

* cited by examiner

INTEGRATED ASSEMBLIES HAVING POLYCRYSTALLINE FIRST SEMICONDUCTOR MATERIAL ADJACENT CONDUCTIVELY-DOPED SECOND SEMICONDUCTOR MATERIAL

TECHNICAL FIELD

Integrated assemblies having polycrystalline first semiconductor material adjacent conductively-doped second semiconductor material.

BACKGROUND

Semiconductor materials may be incorporated into integrated assemblies. For instance, the semiconductor materials may be utilized to form channel regions and source/drain regions of transistors. The transistors may be utilized as access devices in memory arrays, or in other applications.

It would be desirable to develop improved arrangements of semiconductor materials suitable for utilization in integrated assemblies, and to develop integrated components utilizing the improved arrangements of semiconductor materials.

DETAILED DESCRIPTION OF THE ILLUSTRATED EMBODIMENTS

Some embodiments include integrated assemblies having transistors. The transistors include a channel region between a pair of source/drain regions. The channel region is within a polycrystalline first semiconductor material, and at least one of the source/drain regions is within a second semiconductor material. The first semiconductor material is gated, and the second semiconductor material is not gated. Conductivity-enhancing dopant is within the second semiconductor material. The conductivity-enhancing dopant is neutral type relative to the first semiconductor material. Example embodiments are described with reference to FIGS. 1-5.

Figure 1:
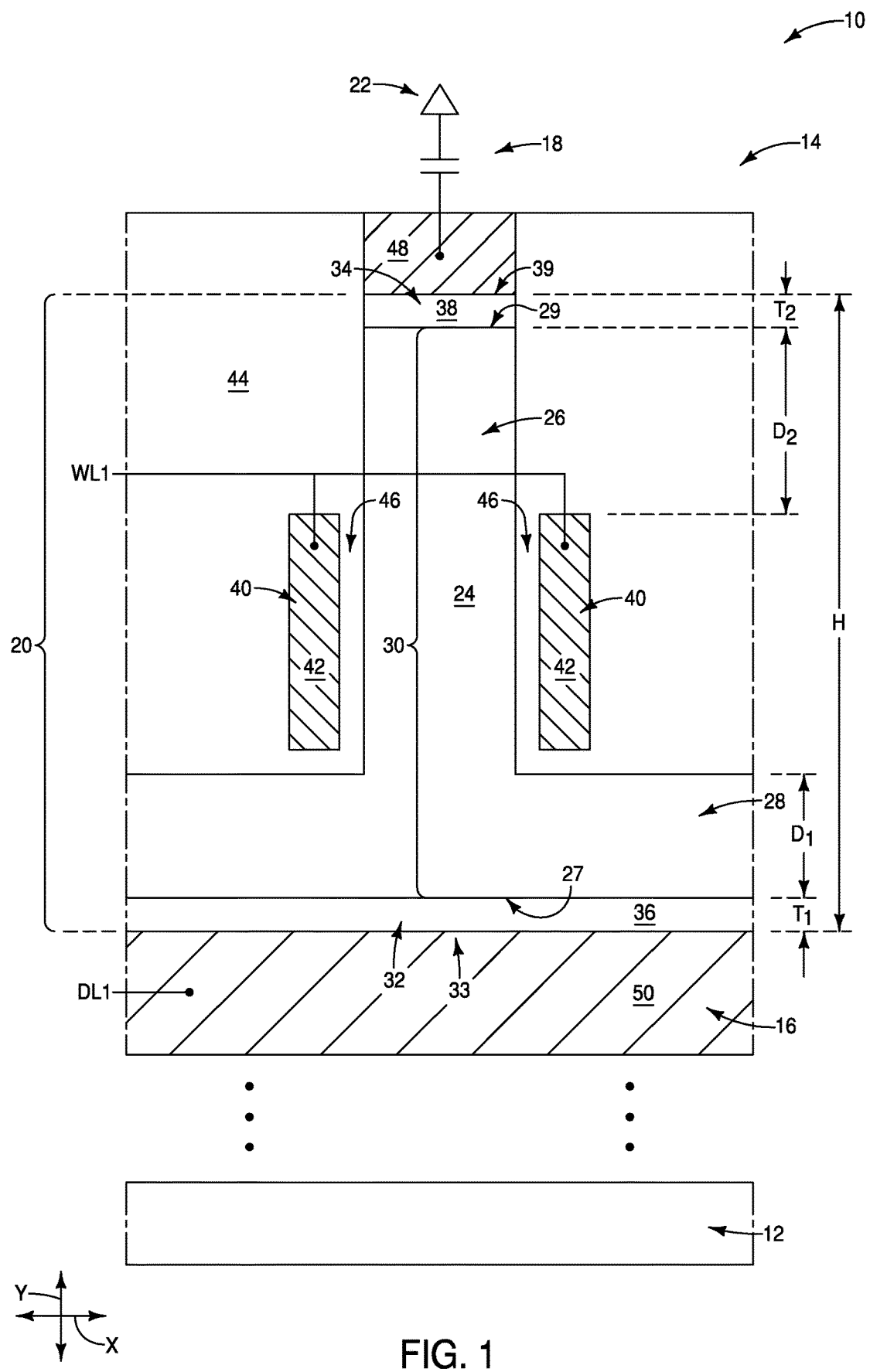
FIG. 1 is a diagrammatic cross-sectional side view of a region of an example integrated assembly comprising an example memory cell.

Referring to FIG. 1, an integrated assembly 10 includes a memory cell 14 over a digit line 16; with the memory cell and digit line being supported by a base 12.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 12 and the digit line 16 to indicate that there may be other materials, components, etc., provided between the base 12 and the digit line 16 in some embodiments. For instance, an insulative material (not shown) may be under the digit line 16.

The base 12 extends along a first direction represented by an x-axis. Such first direction may be referred to as a horizontal direction.

The memory cell 14 includes a charge-storage device 18 coupled with a transistor 20.

In the illustrated embodiment, the charge-storage device 18 is a capacitor. In other embodiments, the charge-storage device may have other configurations suitable for reversibly storing charge; and may, for example, comprise phase-change material, conductive-bridging material, etc.

The capacitor 18 has a node coupled with a reference voltage 22. Such reference voltage may be ground, Vcc/2, or any other suitable reference voltage.

The transistor 20 includes a polycrystalline semiconductor material 24. The polycrystalline semiconductor material 24 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from Groups III and V of the periodic table (with Groups III and V being old nomenclature, and now being referred to as Groups 13 and 15). In some embodiments, the polycrystalline semiconductor material 24 may comprise, consist essentially of, or consist of polycrystalline silicon. The polycrystalline material 24 may be entirely polycrystalline and may have a uniform grain size throughout its thickness. Alternatively, in some embodiments the polycrystalline material may not have uniform grain size throughout its thickness and/or may have amorphous regions, voids, or other pockets which are not polycrystalline.

The polycrystalline semiconductor material 24 is configured to include a pillar 26. The pillar 26 extends in a second direction represented by a y-axis. The second direction may be referred to as a vertical direction; and in some embodiments the pillar 26 may be referred to as a vertically-extending pillar.

The pillar 26 is along a base region 28 of the polycrystalline semiconductor material. In some embodiments, the pillar 26 be considered to have a bottom side (i.e., first side) 27, and a top side (i.e. second side) 29. A channel region 30 of the transistor 20 is between the bottom and top sides 27 and 29.

A first source/drain region 32 is under the pillar 26 and adjacent to the bottom side 27, and a second source/drain region 34 is over the pillar 26 and adjacent to the top side 29. In the illustrated embodiment, the first source/drain region 32 is directly against the bottom side 27, and the second source/drain region 34 is directly against the top side 29.

The first source/drain region 32 comprises a first source/drain material 36, and the second source/drain region 34 comprises a second source/drain material 38. The source/drain materials 36 and 38 comprise semiconductor material, and comprise different semiconductor material relative to the polycrystalline semiconductor material 24. In some embodiments, the semiconductor material 24 may be referred to as a first semiconductor material, and the materials 36 and 38 may be referred to as second and third semiconductor materials, respectively. The semiconductor materials 36 and 38 may comprise the same composition as one another, or may comprise different compositions relative to one another.

The semiconductor materials 36 and 38 may have any suitable crystallinity (e.g., may be monocrystalline, amorphous, polycrystalline, etc.) In some embodiments, the semiconductor materials 36 and 38 are polycrystalline, and have good lattice-matching characteristics relative to the polycrystalline material 24.

Ultimately, the semiconductor materials 36 and 38 will be doped with conductivity-enhancing dopant so that such semiconductor materials become either n-type (i.e., the majority of charge carriers are electrons) or p-type (i.e., the majority of charge carriers are holes). There have been prior efforts to utilize polycrystalline semiconductor materials as channel materials of transistor devices. However, it is found that the dopant provided in source/drain regions adjacent the channel material can problematically diffuse or otherwise migrate along grain boundaries of the polycrystalline channel material to penetrate deeply into the channel material. The dopant may then alter the threshold voltages of the transistor devices and problematically impact device performance. Further, crystalline boundaries will vary across a population of transistor devices and accordingly the effect on the threshold voltages will be non-uniform across a population of transistor devices. This can render the population unsuitable for tightly-regulated operations; such as, for example, operations in which the transistors are intended to be utilized as access devices across a memory array.

In some embodiments, the semiconductor materials 36 and 38 are chosen so that the conductivity-enhancing dopant utilized to achieve desired conductivity within such semiconductor materials is neutral-type relative to the polycrystalline semiconductor material 24 (with "neutral-type dopant" being dopant which does not increase the relative proportion of electrons or holes within the semiconductor material). Accordingly, if the conductivity-enhancing dopant utilized within the semiconductor materials 36 and 38 migrates into the semiconductor material 24, such will not be problematic since the dopant is neutral-type relative to the semiconductor material 24.

The semiconductor materials 36 and 38 may comprise any suitable composition(s); and in some embodiments may comprise, consist essentially of, or consist of one or more of silicon, germanium, III/V semiconductor material (e.g., gallium phosphide), semiconductor oxide, etc.; with groups III and V being old nomenclature, and now being referred to as Groups 13 and 15 of the periodic table.

In some embodiments, the first semiconductor material 24 may comprise, consist essentially of, or consist of silicon; and the second and third semiconductor materials 36 and 38 may both comprise, consist essentially of, or consist of a composition comprising at least one element from Group 13 of the periodic table in combination with at least one element from Group 15 of the periodic table. For instance, such composition may include one or more of GaP, AlAs, GaAs, AlP, InP, AlSb, GaAlAs, GaInAs, GaInP, etc.; where the chemical formulas indicate primary constituents rather than specific stoichiometries. In some specific embodiments, the source/drain materials 36 and 38 may both comprise, consist essentially of, or consist of a composition comprising gallium in combination with phosphorus (e.g., GaP).

Numerous dopants are available which enhance conductivity in the source/drain regions 32 and 34 while being neutral-type relative to semiconductor material 24 in embodiments in which the semiconductor material 24 comprises silicon, and in which the semiconductor materials 36 and 38 comprise compositions containing elements from Groups 13 and 15 of the periodic table. Example dopants may include one or more elements selected from Group 14 of the periodic table. For instance, in some embodiments the conductivity-enhancing dopant utilized within the semiconductor materials 34 and 36 may include one or more of silicon, carbon and germanium. The conductivity-enhancing dopant utilized within the semiconductor material 36 of the first source/drain region 32 may be the same as that utilized within the semiconductor material 38 of the second source/drain region 34, or may be different relative to that utilized within the semiconductor material 38 of the second source/drain region.

In some embodiments, the first semiconductor material 24 may comprise, consist essentially of, or consist of silicon; and the second and third semiconductor materials 36 and 38 may both comprise a semiconductor oxide. The semiconductor oxide may comprise any suitable composition(s); and in some embodiments may include one or more of indium, zinc, tin and gallium. For instance, the semiconductor oxide may comprise, consist essentially of, or consist of a composition having oxygen in combination with indium, zinc and gallium. The indium, zinc and gallium may be considered to be metals within such composition. The stoichiometric content of the composition may be expressed as a metal atomic percent. Specifically, the content of each of the metals of the semiconductor oxide may be expressed in terms of its concentration relative to the total concentration of all of the metals of the semiconductor oxide; and ignoring the concentration of the oxygen. In some example embodiments, the semiconductor oxide of materials 36 and 38 may comprise a metal atomic percent of indium within a range of from about 16 to about 26, a metal atomic percent of gallium within a range of from about 45 to about 55, and a metal atomic percent of zinc within a range of from about 24 to about 34. In some example embodiments, the metal atomic percent of indium may be within a range of from about 18 to about 24, the metal atomic percent of gallium may be within a range of from about 47 to about 53, and the metal atomic percent of zinc may be within a range of from about 26 to about 32.

Numerous dopants are available which enhance conductivity in the source/drain regions 32 and 34 while being neutral-type relative to semiconductor material 24 in embodiments in which the semiconductor material 24 comprises silicon, and in which the semiconductor materials 36 and 38 comprise semiconductor oxide. Example dopants include hydrogen (e.g., $H_2$). An advantage of $H_2$ may be that such may passivate grain boundaries within the polycrystalline silicon 24 and otherwise improve device performance to the extent that the $H_2$ diffuses into the polycrystalline silicon 24.

The transistor 20 includes a transistor gate 40 overlapping the polycrystalline semiconductor material 24, and not overlapping the first and second source/drain regions 32 and 34. Specifically, in the illustrated embodiment of FIG. 1 the transistor gate vertically-overlaps the channel region 30 (i.e., is adjacent to the channel region), and does not vertically-overlap the source/drain regions 32 and 34 (i.e., is not adjacent to the source/drain regions). It is desirable that the source/drain regions 32 and 34 not be gated by the transistor gate 40 because gating of the source/drain regions may increase off-state leakage of the transistor 20.

The transistor gate 40 is coupled with a wordline WL1, and is configured to induce an electric field across a portion of the channel region 30 in response to voltage being provided along the wordline WL1. The transistor gate 40 is an example of an electrical gate configured to induce an electric field across a portion of the polycrystalline semiconductor material 24.

The gate 40 comprises conductive gate material 42. Such material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Insulative material 44 extends along sidewalls of the pillar 26, and around the transistor gate 40. The insulative material 44 may comprise any suitable composition(s); and in some embodiments may comprise one or more of silicon dioxide and various high-k materials (with the term high-k meaning a dielectric constant greater than that of silicon dioxide). Regions of the insulative material 44 between the gate 40 and the pillar 26 correspond to gate dielectric material 46 (also referred to as gate insulative material). Such regions may comprise the same composition as the remaining portions of insulative material 44, or may comprise different compositions relative to the remaining portions of insulative material 44. In some embodiments, the gate dielectric material 46 may comprise, consist essentially of, or consist of silicon oxide.

Example dimensions are provided relative to the transistor 20. Specifically, the transistor may comprise a height H from a bottom surface 33 of source/drain material 36 to a top surface 39 of source/drain material 38 of at least about 500 nanometers (nm). The source/drain regions 32 and 34 may comprise thicknesses T1 and T2, respectively, of from about 5 nm to about 100 nm. The thicknesses T1 and T2 may be about the same as one another, or may be different relative to one another (with the term "about the same" meaning the same to within reasonable tolerances of fabrication and measurement). The bottom source/drain region 32 may be vertically offset from a bottom of the gate 40 by a distance D1 of from about 5 nm to about 100 nm; and the top source/drain region 34 may be vertically offset from a top of the gate 40 by a distance D2 of from about 5 nm to about 100 nm. The distances D1 and D2 may be about the same as one another, or may be different relative to one another.

The top source/drain region 34 is electrically coupled with the charge-storage device 18. In the shown embodiment, the top source/drain region 34 is directly against a conductive material 48, which in turn is coupled with the charge-storage device 18. The conductive material 48 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The bottom source/drain region 32 is electrically coupled with the digit line 16, and in the shown embodiment is directly against the digit line 16.

The digit line 16 comprises conductive material 50. Such conductive material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 50 may be referred to as conductive-digit-line-material.

The digit line 16 is shown to be part of a digit line labeled as DL1. The digit line DL1 and the wordline WL1 may be representative of numerous wordlines and digit lines extending across a memory array, and the memory cell 14 may be representative of multiple substantially identical memory cells extending across the memory array (with the term "substantially identical" meaning identical to within reasonable tolerances of fabrication and measurement).

Figure 2:
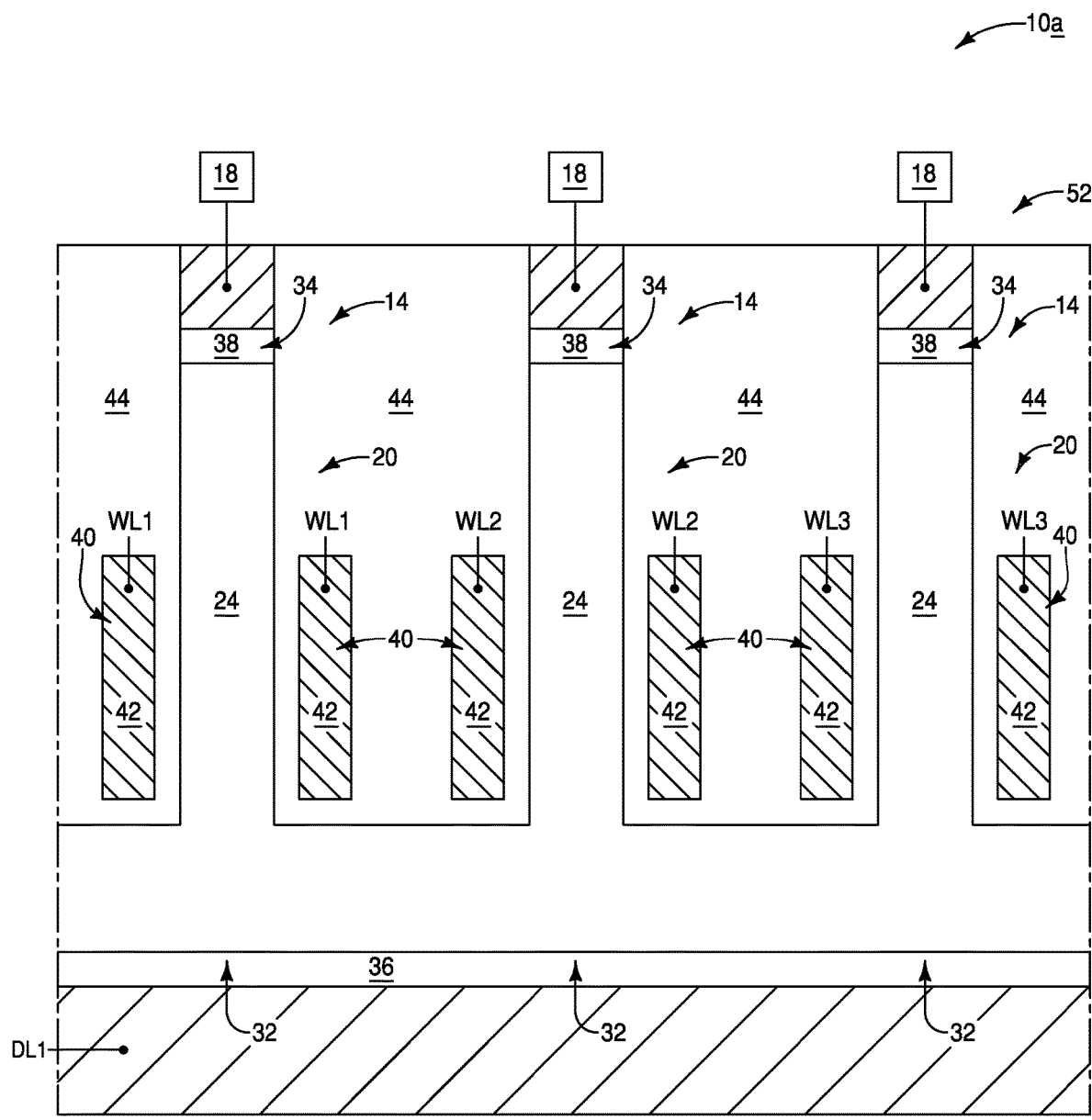
FIG. 2 is a diagrammatic cross-sectional side view of a region of an example integrated assembly comprising a portion of an example memory array.

FIG. 2 shows a portion of an integrated assembly 10a comprising a region of an example memory array 52. The memory array 52 includes memory cells 14 of the type described above with reference to FIG. 1. Each memory cell includes an access transistor 20 coupled with a charge-storage device 18. The charge-storage devices 18 are diagrammatically illustrated with boxes to indicate that such devices may include any suitable components. The components may be capacitors of the type shown in FIG. 1, or may be other suitable devices which reversibly store charge. Each of the memory cells 14 includes a gate 40, with the gates being coupled to wordlines WL1, WL2 and WL3.

Figure 3:
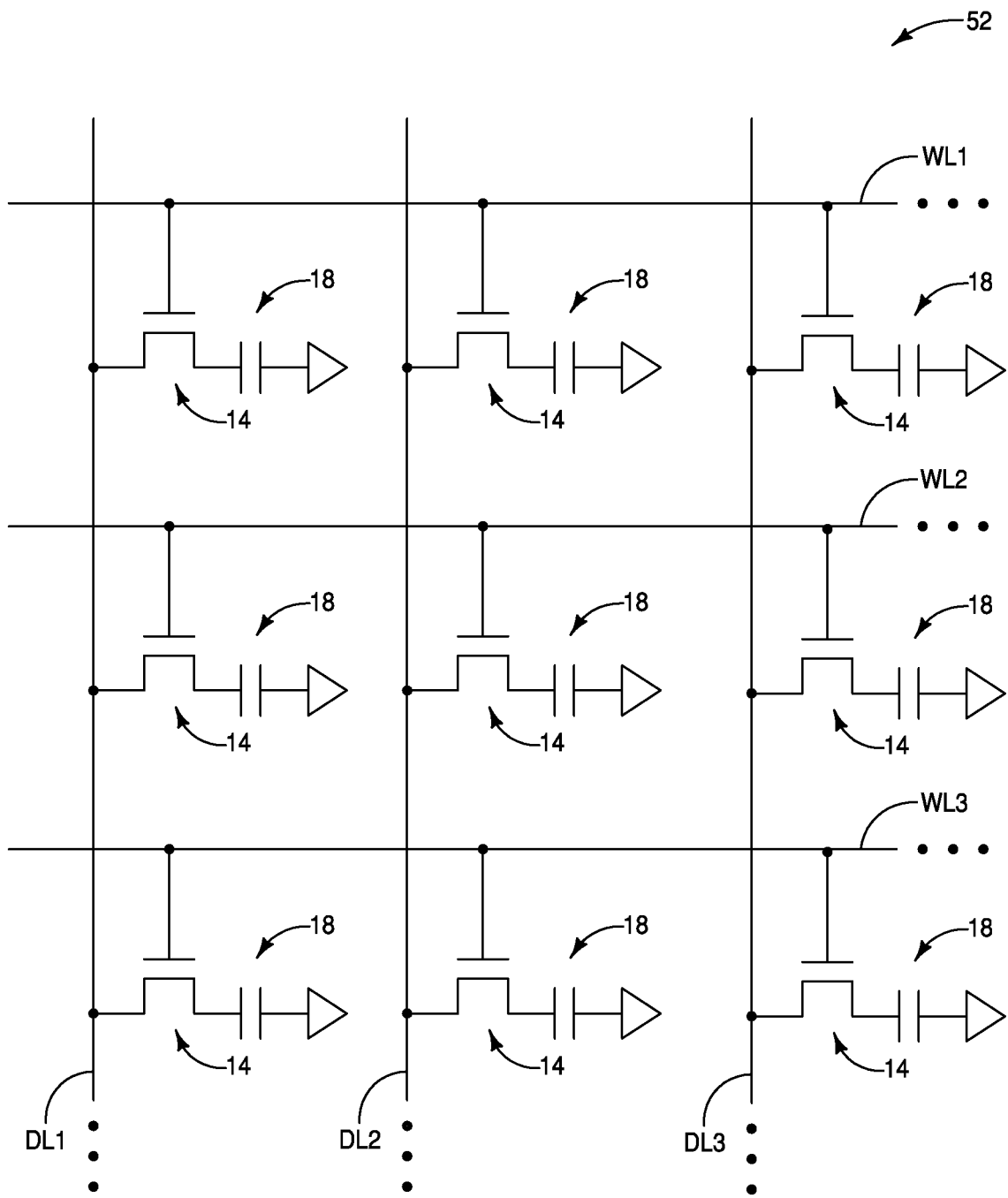
FIG. 3 is a diagrammatic schematic illustration of a region of an example memory array.

FIG. 3 schematically illustrates a portion of the memory array 52, and shows such memory array comprising digit lines DL1, DL2 and DL3, together with the wordlines WL1, WL2 and WL3. Each of the memory cells 14 within the memory array is uniquely addressed through a combination of one of the wordlines and one of the digit lines. The memory array may include any suitable number of memory cells 14; and in some embodiments may comprise hundreds, millions, tens of millions, etc., of memory cells.

Figure 4:
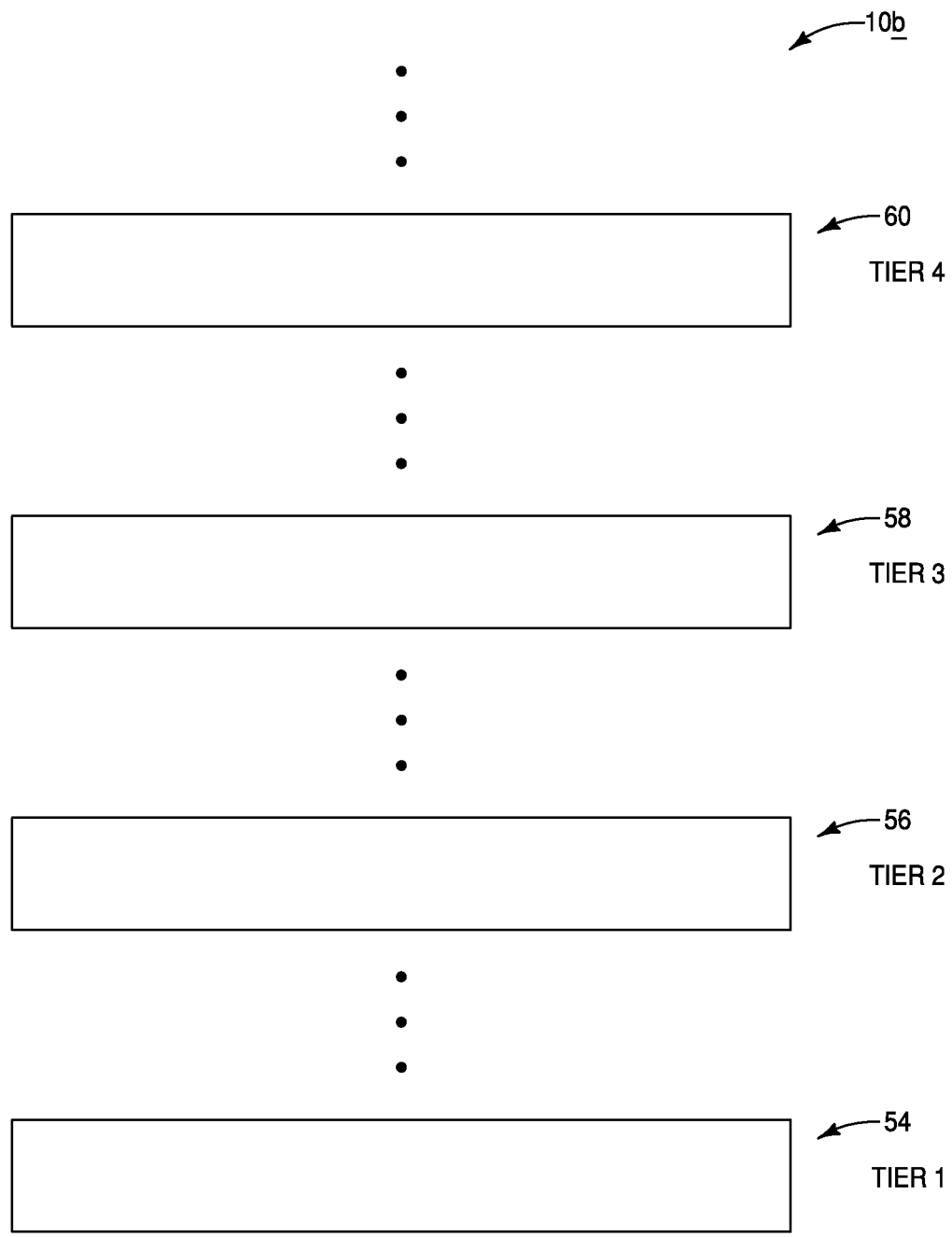
FIG. 4 is a diagrammatic cross-sectional side view of a region of an example assembly comprising stacked tiers.

In some embodiments, the memory array 52 may be within a memory tier (i.e., memory deck) which is within a vertically-stacked arrangement of tiers (or decks). For instance, FIG. 4 shows a portion of an integrated assembly 10b comprising a vertically-stacked arrangement of tiers 54, 56, 58 and 60 (also labeled as tiers 1-4). The vertically-stacked arrangement may extend upwardly to include additional tiers. The tiers 1-4 may be considered to be examples of levels that are stacked one atop the other. The levels may be within different semiconductor dies, or at least two of the levels may be within the same semiconductor die.

The bottom tier (tier 1) may include control circuitry and/or sensing circuitry (e.g., may include wordline drivers, sense amplifiers, etc.); and in some applications may comprise CMOS circuitry. The upper tiers (tiers 2-4) may include memory arrays, such as, for example, the memory array 52 described with reference to FIGS. 2 and 3. The memory arrays within the various tiers may be the same as one another (e.g., may all be DRAM arrays), or may be different relative to one another (e.g., some may be DRAM arrays, while others are NAND arrays). Also, one or more of the upper tiers may include control circuitry or other logic circuitry.

In some embodiments, it is found that it can be relatively straightforward to utilize monocrystalline semiconductor material (e.g., monocrystalline silicon) in circuit devices fabricated in the bottom tier (e.g., tier 1), but it can be difficult to utilize monocrystalline semiconductor material in the upper tiers. Instead, it is easier to utilize polycrystalline semiconductor material (e.g., polycrystalline silicon) in the upper tiers. Accordingly, it is desired to develop memory arrays having polycrystalline channel material within the access transistors. The transistors 20 of FIGS. 1 and 2 may be particularly suitable for utilization in the upper tiers in that the transistors utilize polycrystalline channel material, and may have uniform electrical properties (e.g., on-current, off-current, threshold voltage, etc.) across the population of transistors within the memory array.

Figure 5:
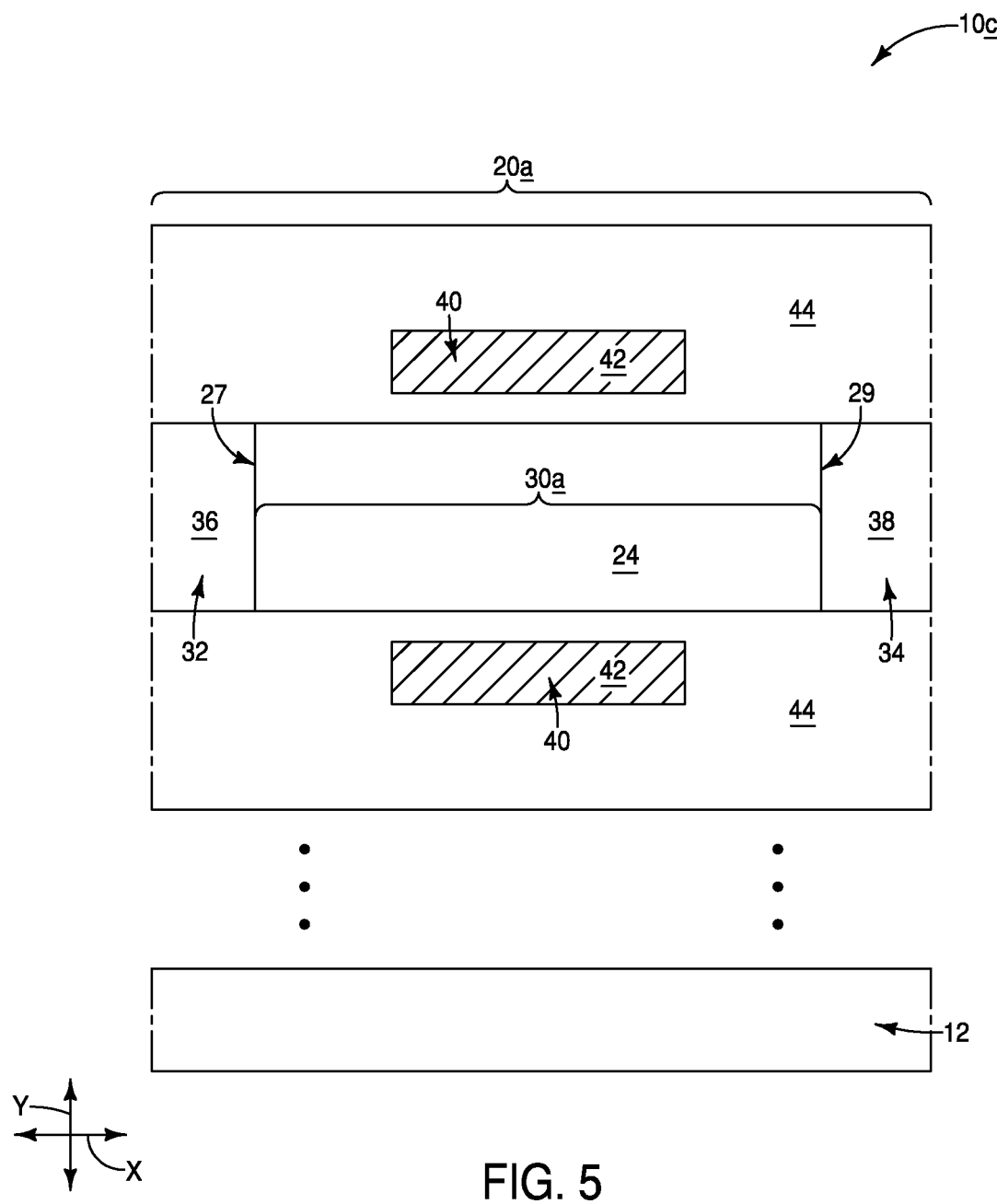
FIG. 5 is a diagrammatic cross-sectional side view of a region of an example integrated assembly comprising an example transistor.

The embodiment of FIG. 1 shows a transistor 20 having a vertically-extending channel region. In other embodiments, analogous transistors may be configured to have horizontally-extending channel regions. For instance, FIG. 5 shows a portion of an integrated assembly 10c having a transistor 20a with a horizontally-extending channel region 30a. The transistor 20a supported by the base 12, and is similar to the transistor 20 of FIG. 1 except that the channel region 30a of the transistor 20a extends horizontally, while the channel region 30 of the transistor 20 of FIG. 1 extends vertically. In some embodiments, the polycrystalline semiconductor material 24 of the transistor 20a of FIG. 5 may be considered to have the first side 27 and the second side 29 in a horizontally-disposed relation relative to one another. In contrast, the same first and second sides 27 and 29 of the transistor 20 of FIG. 1 are in a vertically-disposed relation relative to one another.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a polycrystalline first semiconductor material, and having a second semiconductor material directly adjacent to the polycrystalline first semiconductor material. The second semiconductor material is of a different composition than the polycrystalline first semiconductor material. A conductivity-enhancing dopant is within the second semiconductor material. The conductivity-enhancing dopant is a neutral-type dopant relative to the polycrystalline first semiconductor material. An electrical gate is adjacent to a region of the polycrystalline first semiconductor material and is configured to induce an electric field within said region of the polycrystalline first semiconductor material. The gate is not adjacent to the second semiconductor material.

Some embodiments include an integrated assembly comprising a polycrystalline semiconductor material having a first side and an opposing second side, and comprising a channel region. A first source/drain material is adjacent to the first side of the polycrystalline semiconductor material. A first conductivity-enhancing dopant is within the first source/drain material. The first conductivity-enhancing dopant is a neutral-type dopant relative to the polycrystalline semiconductor material. A second source/drain material is adjacent to the second side of the polycrystalline semiconductor material. A second conductivity-enhancing dopant is within the second source/drain material. The second conductivity-enhancing dopant is a neutral-type dopant relative to the polycrystalline semiconductor material. A transistor gate is adjacent to the polycrystalline semiconductor material and is not adjacent to the first and second source/drain materials; and is configured to gatedly couple the first and second source/drain materials through the channel region.

Some embodiments include an integrated assembly comprising a base and a vertically extending pillar of polycrystalline semiconductor material supported by the base. The pillar has a bottom side and a top side. The pillar comprises a channel region between the bottom and top sides. A first source/drain material is under the pillar and adjacent to the bottom side. A first conductivity-enhancing dopant is within the first source/drain material. The first conductivity-enhancing dopant is neutral-type dopant relative to the polycrystalline semiconductor material. A second source/drain material is over the pillar and adjacent to the top side. A second conductivity-enhancing dopant is within the second source/drain material. The second conductivity-enhancing dopant is a neutral-type dopant relative to the polycrystalline semiconductor material. A transistor gate is adjacent to the polycrystalline semiconductor material, and is not adjacent to the first and second source/drain materials; and is configured to gatedly couple the first and second source/drain materials through the channel region. A charge-storage device is coupled with one of the first and second source/drain materials.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
    a polycrystalline first semiconductor material;
    a second semiconductor material directly adjacent to the polycrystalline first semiconductor material and being of a different composition than the polycrystalline first semiconductor material;
    a conductivity-enhancing dopant within the second semiconductor material, the conductivity-enhancing dopant being a neutral-type dopant relative to the polycrystalline first semiconductor material; and
    an electrical gate adjacent to a region of the polycrystalline first semiconductor material and being configured to induce an electric field within said region of the polycrystalline first semiconductor material; the gate not being adjacent to the second semiconductor material.

2. The integrated assembly of claim 1 wherein the second semiconductor material is polycrystalline.

3. The integrated assembly of claim 1 wherein the polycrystalline first semiconductor material comprises silicon, and wherein the second semiconductor material comprises at least one element from Group 13 of the periodic table in combination with at least one element from Group 15 of the periodic table.

4. The integrated assembly of claim 3 wherein the second semiconductor material comprises gallium and phosphorus.

5. The integrated assembly of claim 4 wherein the conductivity-enhancing dopant includes one or more elements from Group 14 of the periodic table.

6. The integrated assembly of claim 4 wherein the conductivity-enhancing dopant includes one or more of silicon, germanium and carbon.

7. The integrated assembly of claim 1 wherein the polycrystalline first semiconductor material comprises silicon, and wherein the second semiconductor material comprises a semiconductor oxide.

8. The integrated assembly of claim 7 wherein the semiconductor oxide includes one or more of indium, zinc, tin and gallium.

9. The integrated assembly of claim 7 wherein the semiconductor oxide includes indium, zinc and gallium.

10. The integrated assembly of claim 9 wherein the conductivity-enhancing dopant includes hydrogen.

11. The integrated assembly of claim 9 wherein the indium, zinc and gallium are each present in the semiconductor oxide to a metal atomic percent, and wherein:
    the metal atomic percent of the indium is within a range of from about 16 to about 26;
    the metal atomic percent of the gallium is within a range of from about 45 to about 55; and
    the metal atomic percent of the zinc is within a range of from about 24 to about 34.

12. The integrated assembly of claim 9 wherein the indium, zinc and gallium are each present in the semiconductor oxide to a metal atomic percent, and wherein:
    the metal atomic percent of the indium is within a range of from about 18 to about 24;
    the metal atomic percent of the gallium is within a range of from about 47 to about 53; and
    the metal atomic percent of the zinc is within a range of from about 26 to about 32.

13. An integrated assembly, comprising:
    a polycrystalline semiconductor material having a first side and an opposing second side, and comprising a channel region between the first and second sides;
    a first source/drain material adjacent to the first side of the polycrystalline semiconductor material;
    a first conductivity-enhancing dopant within the first source/drain material, the first conductivity-enhancing dopant being a neutral-type dopant relative to the polycrystalline semiconductor material;
    a second source/drain material adjacent to the second side of the polycrystalline semiconductor material;
    a second conductivity-enhancing dopant within the second source/drain material, the second conductivity-enhancing dopant being a neutral-type dopant relative to the polycrystalline semiconductor material; and
    a transistor gate adjacent to the polycrystalline semiconductor material and not being adjacent to the first and second source/drain materials, and being configured to gatedly couple the first and second source/drain materials through the channel region.

14. The integrated assembly of claim 13 comprising a base under the polycrystalline semiconductor material and supporting the polycrystalline semiconductor material; and wherein the first source/drain material and the second source/drain material are horizontally disposed relative to one another.

15. The integrated assembly of claim 13 comprising a base under the polycrystalline semiconductor material and supporting the polycrystalline semiconductor material; and wherein the first source/drain material and the second source/drain material are vertically disposed relative to one another.

16. The integrated assembly of claim 13 wherein the first and second source/drain materials comprise a same composition as one another.

17. The integrated assembly of claim 16 wherein the first and second conductivity-enhancing dopants comprise a same element as one another.

18. The integrated assembly of claim 16 wherein the first and second conductivity-enhancing dopants comprise different elements relative to one another.

19. The integrated assembly of claim 13 wherein the first and second source/drain materials comprise different compositions relative to one another.

20. The integrated assembly of claim 13 wherein the polycrystalline first semiconductor material comprises silicon; wherein the first and second source/drain materials comprise a same composition as one another; and wherein said same composition comprises at least one element from Group 13 of the periodic table in combination with at least one element from Group 15 of the periodic table.

21. The integrated assembly of claim 20 wherein said same composition comprises gallium and phosphorus.

22. The integrated assembly of claim 21 wherein the first and second conductivity-enhancing dopants include one or more elements from Group 14 of the periodic table.

23. The integrated assembly of claim 13 wherein the polycrystalline first semiconductor material comprises silicon; wherein the first and second source/drain materials comprise a same composition as one another; and wherein said same composition comprises a semiconductor oxide.

24. The integrated assembly of claim 23 wherein the semiconductor oxide includes one or more of indium, zinc, tin and gallium.

25. The integrated assembly of claim 23 wherein the semiconductor oxide includes indium, zinc and gallium.

26. The integrated assembly of claim 25 wherein the conductivity-enhancing dopant includes hydrogen.

27. An integrated assembly, comprising:
a base;
a vertically extending pillar of polycrystalline semiconductor material supported by the base;
the pillar having a bottom side and a top side; the pillar comprising a channel region between the bottom and top sides;
a first source/drain material under the pillar and adjacent to the bottom side;
a first conductivity-enhancing dopant within the first source/drain material, the first conductivity-enhancing dopant being a neutral-type dopant relative to the polycrystalline semiconductor material;
a second source/drain material over the pillar and adjacent to the top side;
a second conductivity-enhancing dopant within the second source/drain material, the second conductivity-enhancing dopant being a neutral-type dopant relative to the polycrystalline semiconductor material;
a transistor gate adjacent to the polycrystalline semiconductor material, the transistor gate being absent from along the first and second source/drain materials, and being configured to gatedly couple the first and second source/drain materials through the channel region; and
a charge-storage device coupled with one of the first and second source/drain materials.

28. The integrated assembly of claim 27 wherein the polycrystalline semiconductor material, first source/drain material, second source/drain material and transistor gate are comprised by an access transistor; wherein the access transistor and the charge-storage device are comprised by a memory cell; wherein the transistor gate is coupled with a wordline; and wherein the other of the first and second source/drain materials is coupled with a digit line.

29. The integrated assembly of claim 28 wherein the memory cell is one of many substantially identical memory cells within a memory array; wherein the wordline is one of many wordlines within the memory array; wherein the digit line is one of many digit lines within the memory array; and wherein each of the memory cells is uniquely addressed through one of the digit lines in combination with one of the wordlines.

30. The integrated assembly of claim 29 wherein the memory array is within a tier; the tier being within a vertically-stacked arrangement of tiers and being over at least one other of the tiers within the vertically-stacked arrangement.

31. The integrated assembly of claim 27 wherein the polycrystalline first semiconductor material comprises silicon; wherein the first and second source/drain materials comprise a same composition as one another; and wherein said same composition comprises at least one element from Group 13 of the periodic table in combination with at least one element from Group 15 of the periodic table.

32. The integrated assembly of claim 31 wherein said same composition comprises gallium and phosphorus.

33. The integrated assembly of claim 32 wherein the first and second conductivity-enhancing dopants include one or more elements from Group 14 of the periodic table.

34. The integrated assembly of claim 27 wherein the polycrystalline first semiconductor material comprises silicon; wherein the first and second source/drain materials comprise a same composition as one another; and wherein said same composition comprises a semiconductor oxide.

35. The integrated assembly of claim 34 wherein the semiconductor oxide includes one or more of indium, zinc, tin and gallium.

36. The integrated assembly of claim 34 wherein the semiconductor oxide includes indium, zinc and gallium.

37. The integrated assembly of claim 36 wherein the conductivity-enhancing dopant includes hydrogen.

\* \* \* \* \*